(12) United States Patent
Brennan et al.

(10) Patent No.: US 7,109,838 B2
(45) Date of Patent: Sep. 19, 2006

(54) SYSTEM FOR INTEGRATING A TOROIDAL INDUCTOR IN A SEMICONDUCTOR DEVICE

(75) Inventors: Kenneth D. Brennan, Flower Mound, TX (US); Douglas A. Prinslow, McKinney, TX (US); David B. Aldrich, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 985 days.

(21) Appl. No.: 09/953,310

(22) Filed: Sep. 10, 2001

(65) Prior Publication Data

US 2002/0058355 A1    May 16, 2002

Related U.S. Application Data

(60) Provisional application No. 60/230,886, filed on Sep. 8, 2000.

(51) Int. Cl.
*H01F 5/00*    (2006.01)

(52) U.S. Cl. .................................... 336/200; 336/229
(58) Field of Classification Search ............... 336/200, 336/229, 225
See application file for complete search history.

(56) References Cited

U.S. PATENT DOCUMENTS 5,793,272 A * 8/1998 Burghartz et al. .......... 336/200
6,037,649 A * 3/2000 Liou .......................... 257/531

* cited by examiner

*Primary Examiner*—Tuyen T Nguyen
(74) *Attorney, Agent, or Firm*—Carlton H. Hoel; W. James Brady, III; Frederick J. Telecky, Jr.

(57) ABSTRACT

An inductor integrated in a semiconductor device comprises a first and second lower electrical trace, an upper electrical trace, aligned at a first end with a first end of the first lower electrical trace and at a second end with a second end of the second lower electrical trace, a first via intercoupling the first end of the upper electrical trace with the first end of the first lower electrical trace, and a second via intercoupling the second end of the upper electrical trace with the second end of the second lower electrical trace.

2 Claims, 5 Drawing Sheets

SYSTEM FOR INTEGRATING A TOROIDAL INDUCTOR IN A SEMICONDUCTOR DEVICE

This application claims priority under 35 USC § 119(e)(1) of provisional application No. 60/230,886 filed Sep. 8, 2000.

FIELD OF THE INVENTION

This invention relates in general, to inductor circuitry, and in particular to, an effective way of integrating a toroidal coil inductor into a device using semiconductor fabrication methods.

BACKGROUND OF THE INVENTION

Since the development of tuned circuits, various types of energies such as electricity, light, and electromagnetism have been used to transmit various forms of stimuli, improving the quality of every day life. The stimuli transmitted from tuned circuits may be in the form of sound, e.g. phones and stereos, or in the form of light, e.g. television and data via a computer monitor. Such elements have enabled businesses as well as families to communicate with other counterparts across the globe conveniently and virtually without delay, resulting in closer bonds.

Tuned circuits have recently been introduced to semiconductor integration technologies. Though semiconductor technology has advanced in virtually every possible way, there is still difficulty when implementing tuned circuit technology. It has been very difficult to integrate large tuned circuit elements without sacrificing frequency extraction capabilities or quality factor ("Q-factor").

An important tuned circuit element making the previously mentioned systems possible is the inductor. Inductors can have a respectively low frequency response, thus they can be utilized for low frequency extraction or limiting, depending on the configuration. Using inductors along with other circuit components make it possible to receive, extract, process, manipulate, and transmit information in the form of energies coving a broad spectrum of frequencies.

Recently, on-chip inductors have been introduced to the semiconductor fabrication process for integration. This process has experience some difficulties. Inductors are essentially a coil of wire or some electrically conductive material. Generally, as the size shrinks, so does their inherent inductance quality factor. Therefore, integrated inductors have respectively low inductances.

Including inductors in semiconductor technologies is also difficult due to the electromagnetic interference generated therein. The fields generated by one circuit element tends to interfere with the signals within other adjacent circuit elements. Additionally, inductors in semiconductor technology tend to couple fields to the substrate inducing Eddy currents within the substrate.

SUMMARY OF THE INVENTION

Therefore, a system for utilizing inductors within an integrated circuit ("IC") without sacrificing the quality of adjacent circuit elements or coupling fields of the inductor to the substrate is now needed; providing cost-effective and efficient performance while overcoming the aforementioned limitations of conventional methods.

The present invention provides a semiconductor circuit comprising a first and second lower electrical trace, an upper electrical trace, aligned at a first end with a first end of the first lower electrical trace and at a second end with a second end of the second lower electrical trace, a first via intercoupling the first end of the upper electrical trace with the first end of the first lower electrical trace, and a second via intercoupling the second end of the upper electrical trace with the second end of the second lower electrical trace.

The present invention also provides an inductor formed within a semiconductor process comprising a first lower electrical trace, having first and second ends, a second lower electrical trace, having first and second ends, a third lower electrical trace, having first and second ends, a first upper electrical trace, having a first end aligned with the first end of the first lower electrical trace and a second end aligned with the second end of the second lower electrical trace, a second upper electrical trace, having a first end aligned with the first end of the second lower electrical trace and a second end aligned with the second end of the third lower electrical trace, a first via intercoupling the first end of the first upper electrical trace with the first end of the first lower electrical trace, a second via intercoupling the second end of the first upper electrical trace with the second end of the second lower electrical trace, a third via intercoupling the first end of the second upper electrical trace with the first end of the second lower electrical trace, and a fourth via intercoupling the second end of the second upper electrical trace with the second end of the third lower electrical trace.

The present invention further provides a method of providing an integrated tuned circuit component including providing a first and second lower electrical trace, providing an upper electrical trace, aligned at a first end with a first end of the first lower electrical trace and at a second end with a second end of the second lower electrical trace, providing a first via intercoupling the first end of the upper electrical trace with the first end of the first lower electrical trace, and providing a second via intercoupling the second end of the upper electrical trace with the second end of the second lower electrical trace.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and the use of the present invention is discussed in detail below, it should be appreciated that the present invention provides many applicable inventive concepts which can be embodied in a wide variety of specific contexts. The specific embodiments discussed herein are merely illustrative of specific ways to make and use the invention, do not delimit the scope of the invention.

Figure 1:
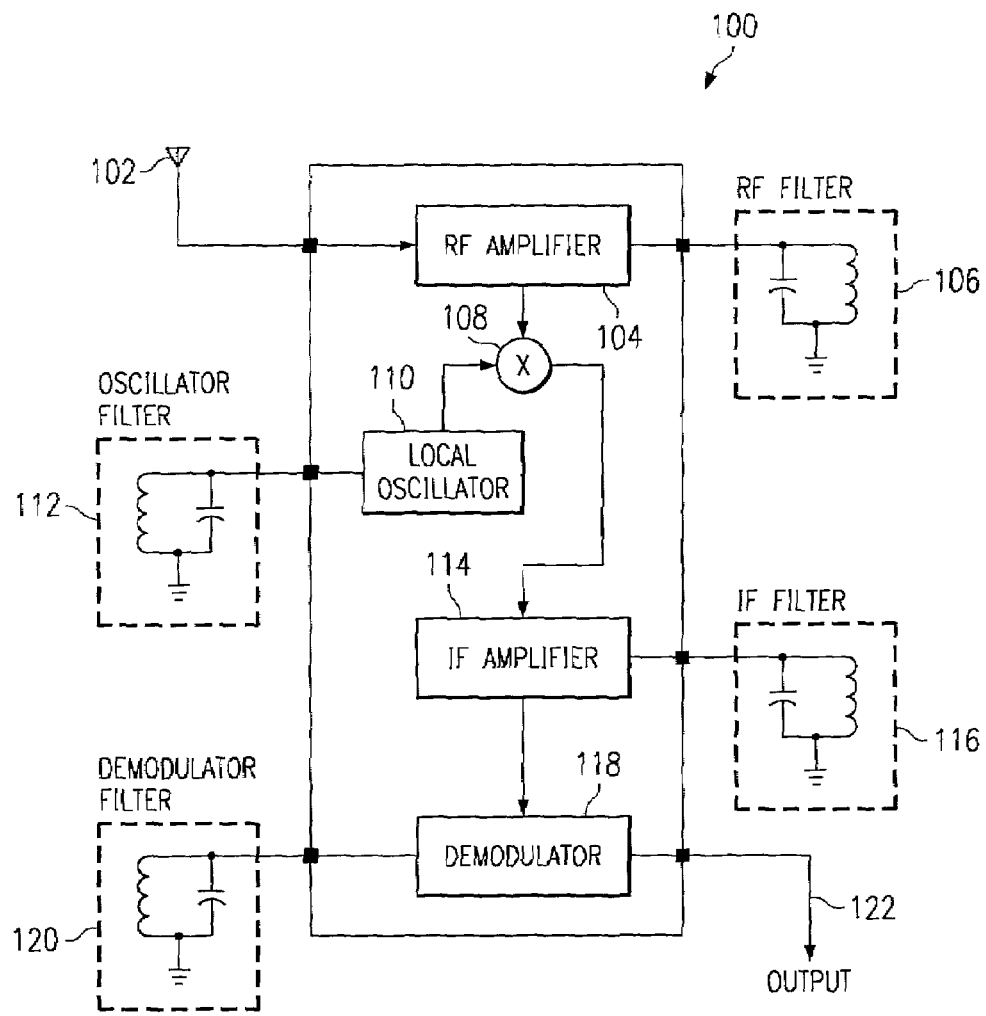
FIG. 1 depicts a prior art telecommunication system.

Referring now to FIG. 1, a prior art telecommunication system is depicted. System 100 is a block diagram of the major components of a super-heterodyne receiver, a basic example of a modern day telecommunication system utilizing integrated circuits (ICs) and off-chip components. System 100 has an antenna 102 which captures a communications signal and transfers it to a radio frequency ("RF") amplifier 104 which amplifies the incoming signal, while filtering it via the off-chip RF filter 106. The now filtered and amplified signal is conducted through a multiplier (or mixer) 108, where it is ☐mixed☐ with a second signal coming from the local oscillator 110. The input signal of local oscillator 110 to multiplier 108 is directly related to the value of another off-chip circuit, the oscillator filter 112. Multiplier 108 combines the two inputs, sending them through intermediate frequency (☐IF☐) amplifier 114, and yet another off-chip filter, IF filter 116. The resultant signal is then processed by demodulator 118, which may be process the signal into a more useable form via another off-chip filter, demodulator filter 120, before transfer to output 122. Since all of the filters are off-chip, they tend to require much more power than the other circuitry. Despite the inefficiency and inconvenience, off-chip filters like filters 106, 112, 116, and 120 are necessary for the signal extraction process. Thus, these off-chip filters are generally used in all conventional telecommunications systems.

Figure 2:
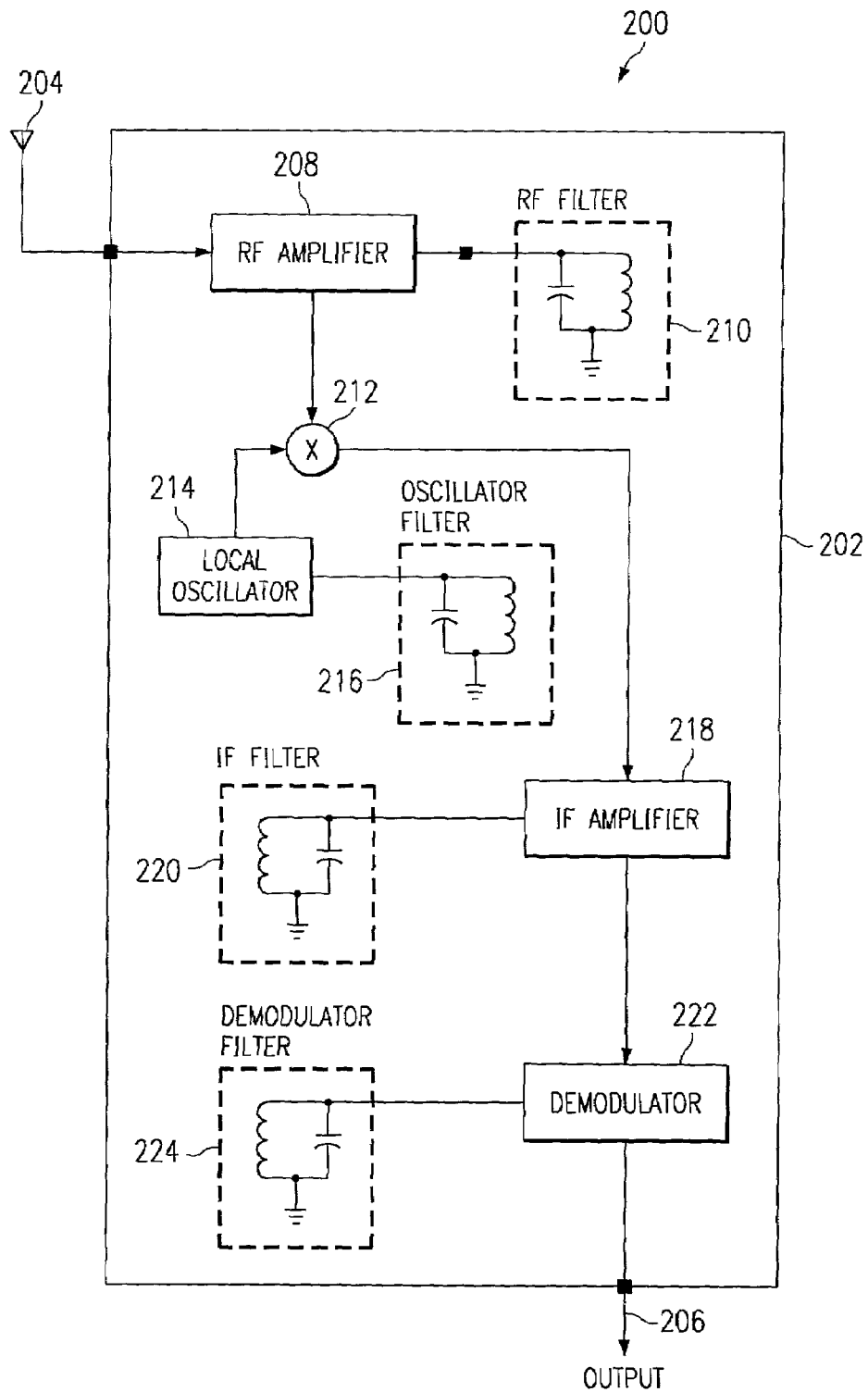
FIG. 2 is an illustrative diagram of a receiver system according to the present invention.

In contrast, FIG. 2 depicts a block diagram of the major components of a super-heterodyne receiver according to the present invention. System 200 comprises IC receiver chip 202, antenna 204, and output port 206. In system 200, all circuitry is contained within IC chip 202. Antenna 204 and output port 206 are the only external components to IC 202. RF amplifier 208 does not use an off-chip filter, instead using RF filter 210 to process the first stage of an incoming signal. A mixer 212 is contained within IC 202. Mixer 212 mixes the signal processed from the RF amplifier 208 with a second signal generated by local oscillator 214. The local oscillator's signal is generated by a combination of on-chip filters, the oscillator filters 216. When mixer 212 combines the two signals together, the IF stage will extract and amplify the useable portion of the signal via IF amplifier 218 and on-chip IF filter 220. After the signal has gone through the IF stage of IC 202, it processes through demodulator 222 which may use various arrays of on-chip filters 224.

Figure 3:
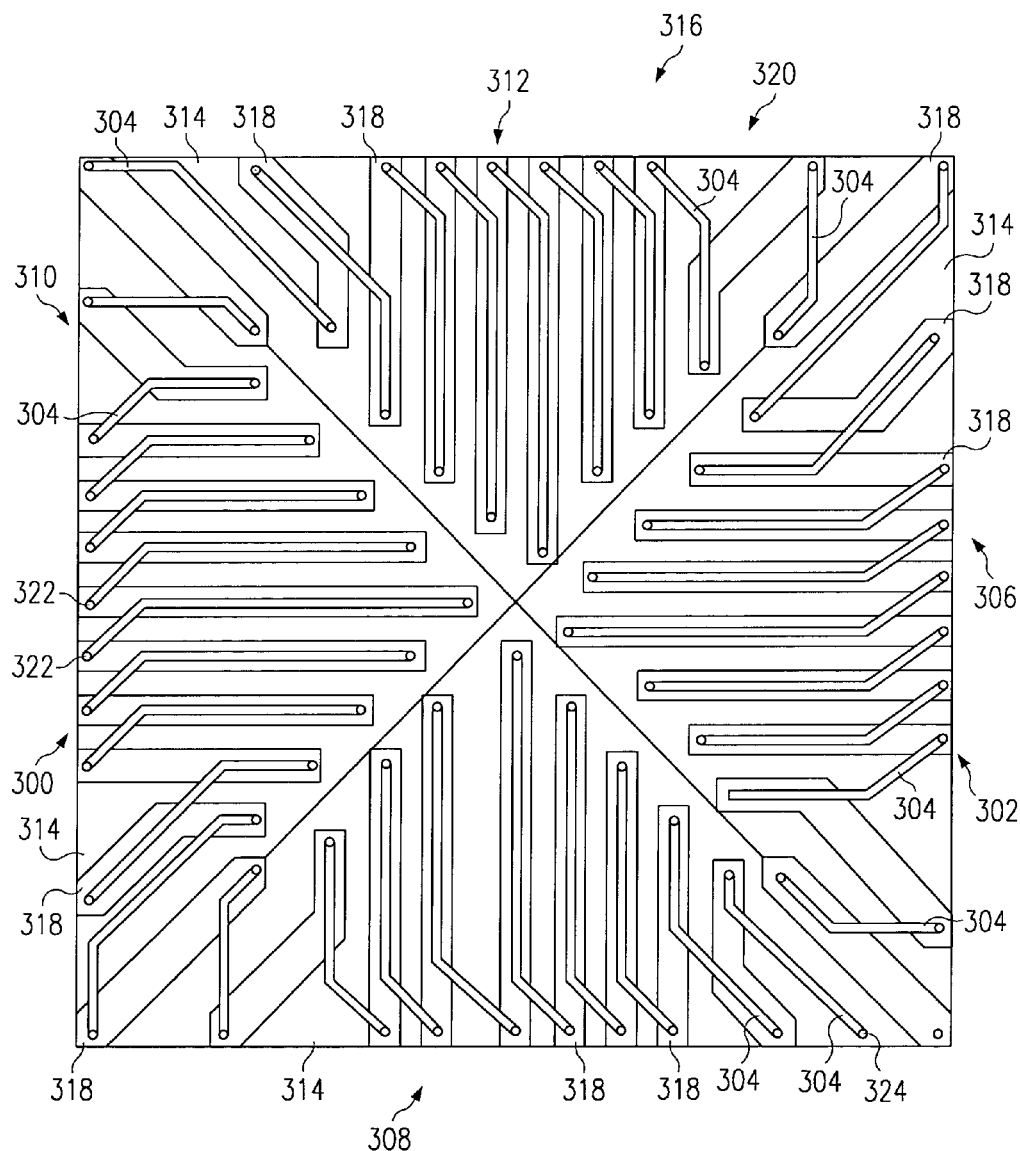
FIG. 3 is an illustrative diagram of an inductor according to the present invention.

The toroidal inductor of the present invention provides efficient on-chip filters required by system 200. Referring now to FIG. 3, a plan view of a toroidal inductor 300 according to the present invention is depicted. Inductor 300 comprises three constituents. The first of these constituents is top level 302, comprising a plurality of thin, coplanar electrically-conductive traces 304. Traces 304 may comprise of aluminum, copper or some combination thereof. Traces 304 are formed to provide the top portion 302 of the toroidal inductor 300. Traces 304 are formed or patterned to maximize the inductance of inductor 300 while optimizing space utilization. This may be accomplished through forming a pattern comprising four quadrants 306, 308, 310, and 312. Each quadrant has is formed to have the same pattern, interpositioned with one another at 90 degree rotations. Level 302 further comprises a layer or multiple instantiations of insulating material 314 between the traces 304. Insulating material 314 may comprise any suitable non-conductive semiconductor material (e.g. an oxide). The second constituent of inductor 300 comprises a lower level 316, comprising plurality of coplanar electrically conductive traces 318, separate and distinct from traces 304. Traces 318 may comprise aluminum, copper or a combination thereof, and are formed to provide a bottom portion of inductor 300. Traces 318 are formed or patterned to utilize the maximum number of traces possible, increasing the inductance of the inductor 300. Again, this may be accomplished through forming a pattern comprising four quadrants 306, 308, 310, and 312; where each quadrant has is formed to have the same pattern, interpositioned with one another at 90 degree rotations. Level 316 further comprises a layer or multiple instantiation of insulating material 314, disposed to separate and insulate traces 318.

Inductor 300 further comprises a third constituent, an insulating level 320. Level 320 insulates level 302 from level 316, while providing a medium in which a vertical portion of inductor 300, comprising vias 322, may be formed or disposed.

As an example, one embodiment of a beginning and end of inductor 300 may be represented by contacts 324 and 326, respectively. The location of the beginning and end of the inductor is shown as an example only, and may be otherwise selected or formed in accordance with the present invention. In this embodiment, beginning 324 is located within level 302. End 326 is located within level 316. Each trace 304 is disposed in substantial vertical alignment with a corresponding trace 318. At an end closest to the center of inductor 300, traces 304 and 318 are adjoined by a corresponding via 322. At an end closest to the outer edge of inductor 300, a trace 304 is shaped or formed to deviate from alignment with its corresponding trace 318, and to extend to a corresponding outer portion of an adjacent trace 318, where a via 322 intercouples the two. Each set of traces 304 and 318 is similarly disposed and connected. Thus, traces 304 and 318 are formed and vertically interconnected with vias 322 to provide an effective toroidal coil inductor from beginning 324 to end 326. The present invention thus utilizes vias as an integral circuit element.

Figure 4:
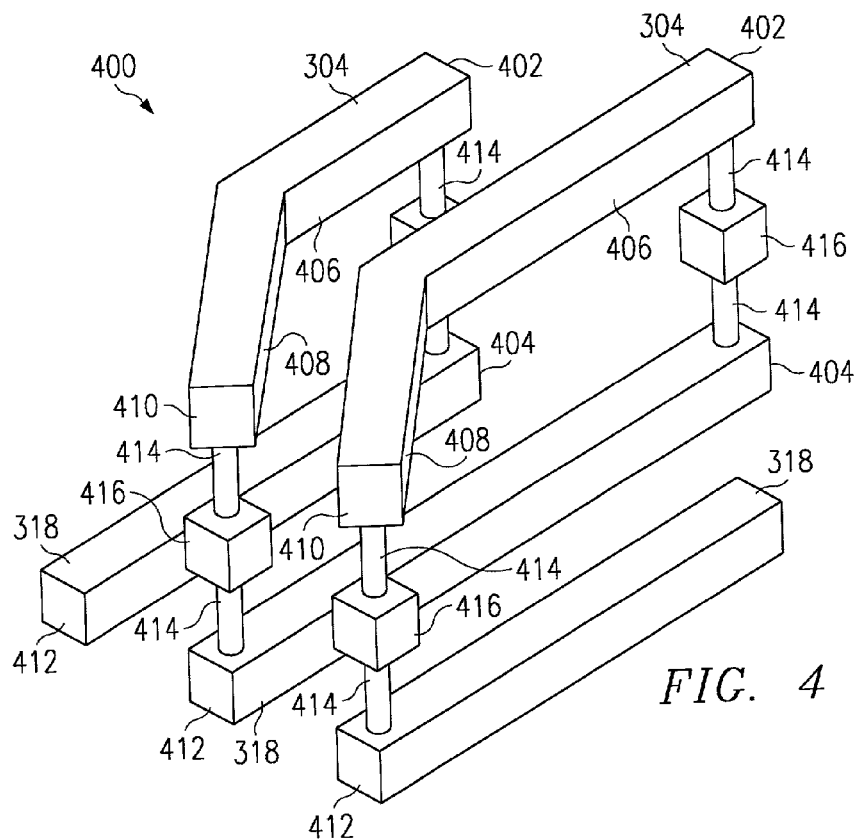
FIG. 4 depicts an embodiment of an inductor segment according to the present invention.

Further illustration is now provided in reference to FIG. 4. This figure shows a perspective view of an inductor segment 400 according to the present invention. Segment 400 may represent a portion of the constituent elements comprising indictor 300, illustrating the connecting scheme employed therein. Segment 400 comprises a plurality of traces 304 and 318, having varying lengths. A first end 402 of each trace 304 is aligned with a corresponding first end 404 of a trace 318. A first portion 406 of each trace 304 is parallel and in vertical alignment with its corresponding trace 318. A second portion 408, closest to the second end 410 of each trace 304, is formed or disposed to deviate from alignment with the corresponding trace 318, and to extend into vertical alignment with a second end 412 of an adjacent trace 318. Vias 414 intercouple the vertically aligned ends of traces 304 and 318 through conductive landing pad 416 in level 320. Thus, segment 400 provides a true toroidal coil inductor.

Figure 5:
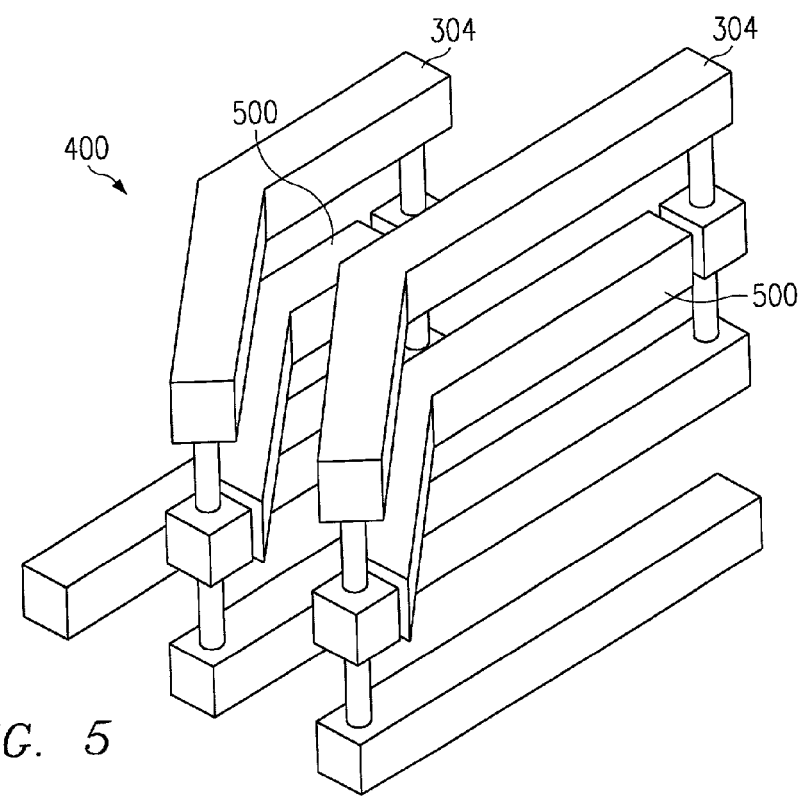
FIG. 5 depicts another embodiment of an inductor segment according to the present invention.

FIG. 5 illustrates an alternative embodiment of segment 400. In contrast to FIG. 4, segment 400 in FIG. 5 further comprises multiple instantiations of ferromagnetic material 500, within level 320. Each trace of material 500 may be formed or disposed in parallel to a corresponding trace 304, as individual traces or as a solid layer. However material 500 is disposed, it is isolated within level 320 from the vias 414.

Figure 6:
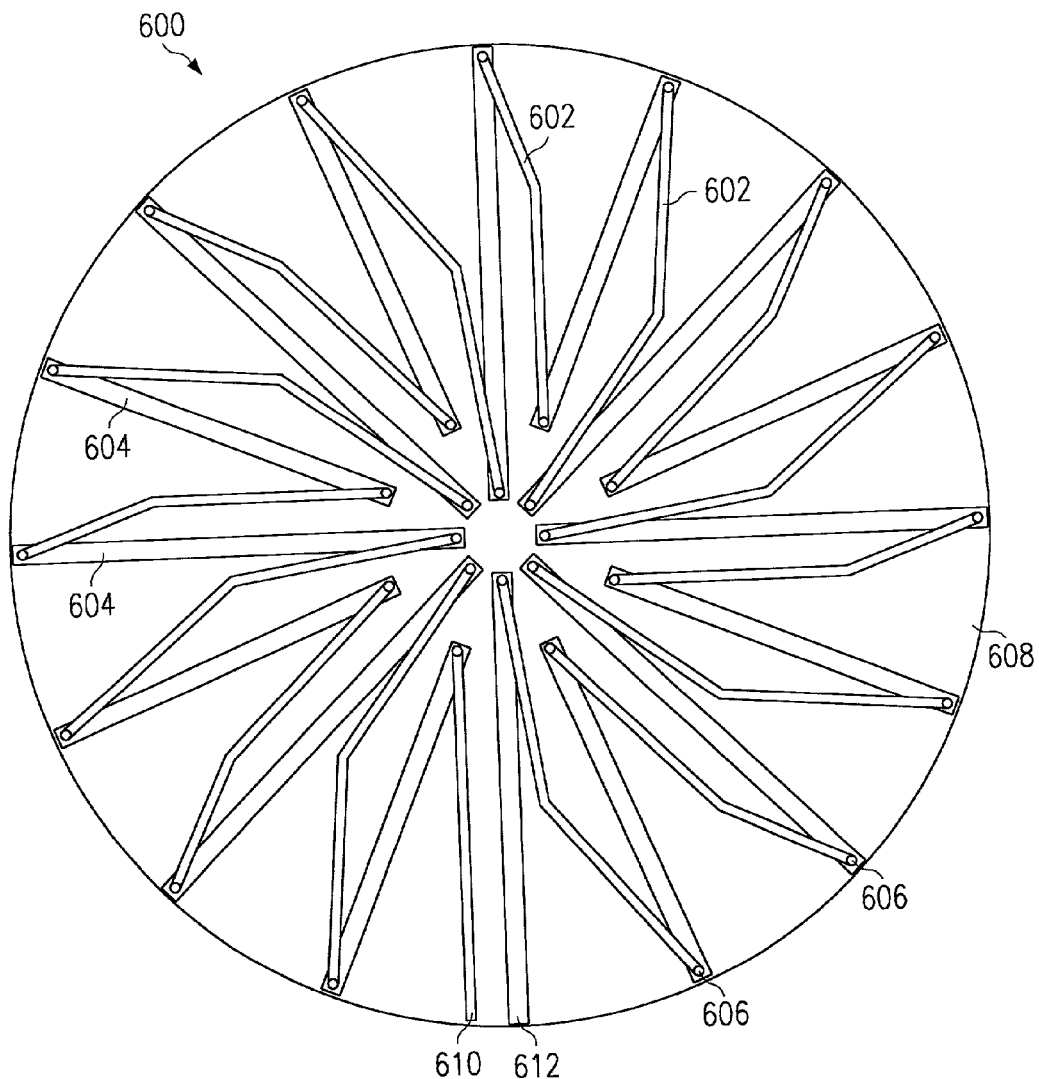
FIG. 6 depicts another embodiment of an inductor according to the present invention.

Referring now to FIG. 6, with continued reference to the disclosure of FIGS. 3, 4, and 5, a plan view of an alternative embodiment of an inductor 600 according to the present invention is depicted. With the exception of its geometric configuration, inductor 600 is similar in structure and material to inductor 300. Inductor 600 is formed in a circular configuration as shown. As should be apparent from the teaching of the present invention, an inductor may be formed in any desired geometric shape or configuration (e.g., oval, polygon, rhombus). Coplanar upper traces 602 are insulated from one another, and are formed or disposed to align at one end with a first lower trace 604 and at a second end with an adjacent lower trace 604. Traces 604 are coplanar and insulated from one another. Traces 602 and 604 are vertically interconnect by vias 606, and separated by an insulating level 608. Similar to inductor 300, inductor 600 is formed with a pattern—here, one that is repeated and turned in by a desired angle. An inductor beginning 610 and end 612 may be located as desired.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. The teachings and concepts of the present invention may be applied to a variety of semiconductor devices and circuitry applications. The principles of the present invention are practicable in a number of technologies. It is therefore intended that the appended claims encompass any such modifications or embodiments.

What is claimed is:

1. An inductor for an integrated circuit containing at least three metal levels, comprising:
   (a) a first plurality of conductive traces, said traces formed in a first metal level;
   (b) a second plurality of conductive traces, said traces formed in a second metal level;
   (c) a plurality of vias connecting said first plurality of traces with said second plurality of traces, said traces and vias forming a toroidal coil, wherein said vias extend through a third metal level, said third metal level between said first metal level and said second metal level.

2. The inductor of claim 1, further comprising:
   (a) ferromagnetic material within said coil and said third metal level.

\* \* \* \* \*